(12) United States Patent
Kim et al.

(10) Patent No.: US 7,911,223 B2
(45) Date of Patent: Mar. 22, 2011

(54) CALIBRATION CIRCUIT OF ON-DIE TERMINATION DEVICE

(75) Inventors: Ki-Ho Kim, Kyoungki-do (KR); Sang-Jin Byeon, Kyoungki-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/054,825

(22) Filed: Mar. 25, 2008

(65) Prior Publication Data

US 2009/0146685 A1    Jun. 11, 2009

(30) Foreign Application Priority Data

Dec. 11, 2007  (KR) .................. 10-2007-0128237

(51) Int. Cl.
*H03K 17/16*    (2006.01)
(52) U.S. Cl. ................. 326/30; 326/83; 326/86; 326/26
(58) Field of Classification Search .............. 326/26, 326/30, 81–83, 86–87; 327/108–109
See application file for complete search history.

(56) References Cited

U.S. PATENT DOCUMENTS

| | | | |
|---|---|---|---|
| 6,356,105 B1 * | 3/2002 | Volk ................................ 326/30 |
| 6,876,248 B2 * | 4/2005 | Nguyen et al. ................ 327/538 |
| 7,230,448 B2 * | 6/2007 | Choe ............................... 326/30 |
| 7,372,295 B1 * | 5/2008 | Wei ................................. 326/30 |
| 7,408,379 B2 * | 8/2008 | Cho et al. ........................ 326/30 |
| 7,443,193 B1 * | 10/2008 | Santurkar et al. ............... 326/30 |
| 7,528,626 B2 * | 5/2009 | Kim ................................ 326/30 |
| 2008/0054981 A1 * | 3/2008 | Hosoe et al. .................. 327/333 |
| 2008/0100333 A1 * | 5/2008 | Kim et al. ....................... 326/30 |

FOREIGN PATENT DOCUMENTS

KR    1020050012931       2/2005
KR    1020070036578 A     4/2007

OTHER PUBLICATIONS

Notice of Allowance issued from Korean Intellectual Property Office on Sep. 29, 2009.
Notice of Preliminary Rejection issued from Korean Intellectual Property Office on Dec. 16, 2008.

* cited by examiner

*Primary Examiner* — James H. Cho
*Assistant Examiner* — Christopher Lo
(74) *Attorney, Agent, or Firm* — IP & T Group LLP

(57) ABSTRACT

A calibration circuit of an on-die termination device includes a code generating unit configured to receive a voltage of a calibration node connected to an external resistor and a reference voltage to generate pull-up calibration codes. The calibration circuit also includes a pull-up calibration resistor unit configured to pull up the calibration node in response to the pull-up calibration codes. The pull-up calibration resistor unit is calibrated such that its resistance becomes higher as a power supply voltage increases.

8 Claims, 5 Drawing Sheets

CALIBRATION CIRCUIT OF ON-DIE TERMINATION DEVICE

CROSS-REFERENCE TO RELATED APPLICATIONS

The present invention claims priority of Korean patent application number 10-2007-0128237, filed on Dec. 11, 2007, which is incorporated by reference in its entirety.

BACKGROUND OF THE INVENTION

The present invention relates to a calibration circuit of an on-die termination (ODT) device used for impedance matching at input/output terminals in semiconductor memory devices, and more particularly, to a technology of constantly maintaining the amount of current at input/output terminals in spite of a fluctuation in a power supply voltage.

Semiconductor devices are implemented into integrated circuit (IC) chips such as central processing units (CPUs), memories, and gate arrays, and are incorporated into a variety of electrical products such as personal computers, servers and workstations. Most semiconductor devices include a receiving circuit configured to receive signals from the outside via input pads and an output circuit configured to provide internal signals to the outside via output pads.

A tendency toward high-speed operation of such electronic products brings about a small swing width of an interface signal between the semiconductor devices, in order to reduce a delay time taken in a signal transfer. However, such a trend that the swing width of the signal gradually becomes small, influences external noise, and further, a signal reflection caused by impedance mismatch in an interface terminal becomes critical. Such impedance mismatch is generally caused by external noise, variation of power supply voltage, change in operating temperature, change in manufacturing process, etc. The impedance mismatch may lead to difficulty in high-speed transmission of data and distortion in output data. If a distorted output signal is transmitted, a set-up/hold time failure or an error in a decision of an input level, etc., may be often caused at a receiving side.

In particular, in order to resolve the above problems, a memory device requiring high-speed performance employs an impedance matching circuit, which is called an ODT circuit, near an input pad inside an IC chip. In a typical ODT scheme, source termination is performed at the transmitting end by an output circuit, and parallel termination is performed by a termination circuit connected in parallel with respect to a receiving circuit coupled to the input pad.

ZQ calibration refers to a procedure of generating pull-up and pull-down calibration codes that vary with PVT (process, voltage and temperature) conditions. The resistance of the ODT device, e.g., termination resistance at a DQ pad in a memory device, is calibrated using the pull-up and pull-down codes achieved from the ZQ calibration. Here, the term of ZQ calibration is derived from the fact that the calibration is performed using a calibration node (ZQ).

Hereinafter, how the ZQ calibration is performed in an ODT device will be described.

FIG. 1 is a block diagram of a calibration circuit configured to perform ZQ calibration in a conventional ODT device.

Referring to FIG. 1, the conventional ODT device includes a pull-up calibration resistor unit 110, a dummy calibration resistor unit 120, a pull-down calibration resistor unit 130, a reference voltage generator 102, comparators 103 and 104, and counters 105 and 106. The pull-up calibration resistor unit 110 includes a plurality of pull-up resistors that are turned on/off in response to\pull-up calibration codes PCODE<0:N>. The dummy calibration resistor unit 120 has the same configuration as the pull-up calibration resistor unit 110. The pull-down calibration resistor unit 130 includes a plurality of pull-down resistors that are turned on/off in response to each of pull-down calibration codes NCODE<0:N>.

The pull-up calibration resistor unit 110 generates the pull-up calibration codes PCODE<0:N> primarily while being calibrated with an external resistor 101 connected to a calibration node ZQ. The dummy calibration resistor unit 120 and the pull-down calibration resistor unit 130 generate the pull-down calibration codes NCODE<0:N> secondarily using the pull-up calibration codes PCODE<0:N> that have been generated by the pull-up calibration resistor unit 110.

The comparator 103 compares a voltage at the calibration node ZQ with a reference voltage VREF (generally, set to VDDQ/2) generated from the reference voltage generator 102, thereby generating up/down signals (UP/DOWN). Herein, the voltage at the calibration node ZQ is generated by coupling the pull-up calibration resistor unit 110 to an external resistor 101 (generally, 240Ω) connected to a ZQ pin that is disposed outside a chip of the calibration node ZQ.

The counter 105 receives the up/down signals (UP/DOWN) to generate the pull-up calibration codes PCODE<0:N> as binary code, which turns on/off the pull-up resistors connected in parallel, thereby calibrating total resistance of the pull-up calibration resistor unit 110. The calibrated resistance of the pull-up calibration resistor unit 110 affects the voltage of the calibration node ZQ again, and the above-described calibration procedure is then repeated. That is, the pull-up calibration resistor unit 110 is calibrated such that the total resistance of the pull-up calibration resistor unit 110 is equal to the resistance of the external resistor 101, which is called a pull-up calibration.

The binary code, i.e., the pull-up calibration code PCODE<0:N>, generated during the pull-up calibration is inputted to the dummy calibration resistor unit 120, thus determining total resistance of the dummy calibration unit 120. In the result, the resistance of the dummy calibration resistor unit 120 is equal to that of the pull-up calibration unit 110. Thereafter, a pull-down calibration is performed in a manner similar to the pull-up calibration. Specifically, the pull-down calibration unit 130 is calibrated such that the voltage at a node A is equal to the reference voltage VREF using the comparator 104 and the counter 106, that is, the total resistance of the pull-down calibration resistor unit 130 is equal to the total resistance of the dummy calibration resistor unit 120, which is called a pull-down calibration.

The binary codes PCODE<0:N> and NCODE<0:N> achieved from the ZQ calibration, i.e., pull-up and pull-down calibrations, are inputted to pull-up and pull-down resistors (termination resistors) at input/output pads, which are similarly configured in the pull-up and pull-down calibration resistor units 110 and 130 of the calibration circuit shown in FIG. 1, thus determining the resistance of the ODT device. In a memory device, resistances of pull-up and pull-down resistors at a DQ pad are determined.

FIG. 2 is a block diagram illustrating how termination resistance of an output driver (termination circuit) of a semiconductor memory device is determined using the calibration codes PCODE<0:N> and NCODE<0:N> generated from the calibration circuit of FIG. 1.

The output driver configured to output data in the semiconductor memory device includes pre-drivers 210 and 220 provided in up/down circuits, and pull-up and pull-down termination resistor units 230 and 240 for outputting data.

The pre-drivers 210 and 220 provided in the up/down circuits control the pull-up termination resistor unit 230 and the pull-down resistor unit 240, respectively. When high-level data is outputted, the pull-up termination resistor unit 230 is turned on so that a data pin DQ goes to a 'HIGH' state. On the contrary, when low-level data is outputted, the pull-down termination resistor unit 240 is turned on so that the data pin DQ goes to a 'LOW' state. That is, the data pin DQ is pull-up or pull-down terminated to thereby output high- or low-level data.

The number of resistors in the pull-up termination resistor unit 230 to be turned on is determined by the pull-up calibration codes PCODE<0:N>, and the number of resistors in the pull-down termination resistor unit 240 to be turned on is determined by the pull-down calibration codes NCODE<0:N>. Specifically, which one is turned on as between the pull-up and pull-down termination resistor units 230 and 240 is mainly determined according to a logic level of output data, but how many resistors are turned on among the resistors provided in the termination resistor units 230 or 240 is determined by the pull-up calibration codes PCODE<0:N> or the pull-down calibration codes NCODE<0:N>.

For reference, target resistances of the pull-up and pull-down termination resistor units 230 and 240 are not necessarily equal to resistances (240Ω) of the calibration resistor units (see units 110, 120 and 130 of FIG. 1) but may be one-half (120Ω) or one-quarter (60Ω) of 240Ω, etc. Since the termination resistance may be changed according to an application system, the termination resistor units 230 and 240 for 240Ω, 120Ω and 60Ω are all provided and they may be selectively used if necessary. In FIG. 2, reference symbols DQP_CTRL and DQN_CTRL denote various exemplary control signals inputted to the pre-drivers 210 and 220.

Since the termination resistance (resistance of each of the pull-up and pull-down termination resistor units 230 and 240) of the output driver of FIG. 2, i.e., the termination circuit of the ODT device is determined using the calibration codes PCODE<0:N> and NCODE<0:N> generated from the calibration circuit of FIG. 1, the output driver always maintain a constant resistance.

When there is a fluctuation in a power supply voltage VDD in a state that the termination resistance is constant, the amount of current flowing through an input/output node DQ also varies. For example, if the power supply voltage VDD increases twice in a state that the termination resistance is constant, the amount of current flowing through the input/output node DQ also increases twice. On the contrary, if the power supply voltage VDD decreases by half in a state that the termination resistance is constant, the amount of current flowing through the input/output node DQ also decreases by half.

According to the ZQ calibration result, a termination resistance is maintained regardless of process, voltage and temperature (PVT) variations, which is an original object of the ZQ calibration. However, some systems employing semiconductor devices often require that the amount of current flowing through the input/output node DQ should be constant rather than requiring a constant termination resistance. Hence, it is necessary to develop new technology to meet such a requirement.

SUMMARY OF THE INVENTION

Embodiments of the present invention are directed to providing a calibration circuit of an on-die termination (ODT) device capable of satisfying a system requirement for a constant current by maintaining the amount of current flowing through an input/output node constant even through a power supply voltage fluctuates.

In accordance with an aspect of the invention, there is provided a code generating unit configured to receive a voltage of a calibration node connected to an external resistor and a reference voltage to generate pull-up calibration codes and a pull-up calibration resistor unit configured to pull up the calibration node in response to the pull-up calibration codes, the pull-up calibration resistor unit being calibrated such that its resistance becomes higher as a power supply voltage increases.

DESCRIPTION OF SPECIFIC EMBODIMENTS

Hereinafter, a calibration circuit of an on-die termination (ODT) device in accordance with the present invention will be described in detail with reference to the accompanying drawings.

Figure 3:
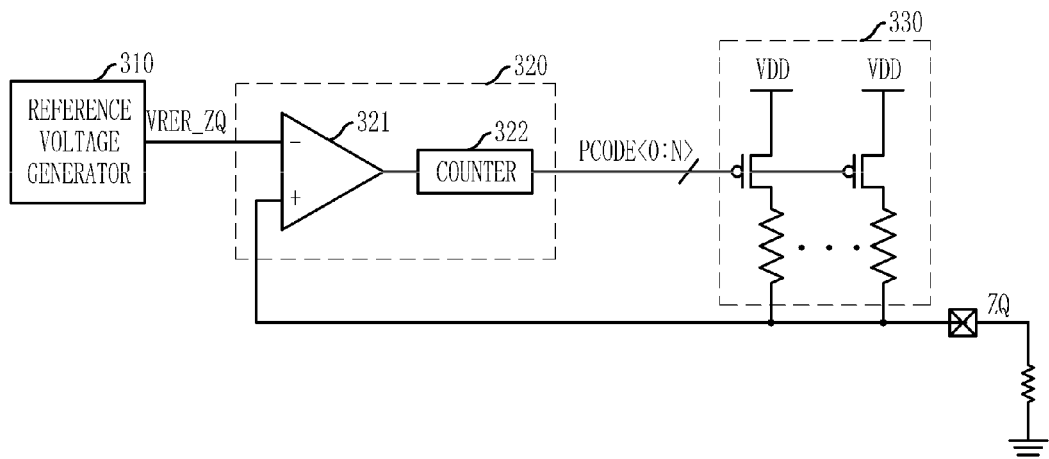
FIG. 3 is a block diagram of a calibration circuit of an ODT device generating only one kind of calibration codes in accordance with an embodiment of the invention.

FIG. 3 is a block diagram of a calibration circuit of an ODT device generating only one kind of calibration codes in accordance with an embodiment of the invention.

Referring to FIG. 3, the calibration circuit in accordance with the embodiment of the invention includes a code generating unit 320 and a calibration resistor unit 330. The code generating unit 320 receives a voltage of a calibration node ZQ connected to an external resistor 301 and a reference voltage VREF to thereby generate pull-up calibration codes PCODE<0:N>. The calibration resistor unit 330 pulls up the calibration node ZQ in response to the pull-up calibration codes PCODE<0:N>, and is calibrated such that its resistance becomes higher as a power supply voltage VDD increases. A reference voltage generator 310 configured to supply a reference voltage VREF_ZQ to the code generating unit 320 and the calibration resistor unit 330 may be provided inside or outside the calibration circuit.

In this embodiment of FIG. 3, a calibration circuit of generating only one kind of calibration codes, i.e., the pull-up calibration codes PCODE<0:N> is illustrated because the calibration circuit does not always generate two kinds of calibration codes PCODE<0:N> and NCODE<0:N>. In the case where an input/output node (DQ) is only pull-up terminated in a termination circuit, the calibration circuit also generates only the pull-up calibration codes PCODE<0:N>.

For example, when a DRAM of graphic purpose receives data, an input/output node (DQ) is only pull-up terminated.

The code generating unit 320 receives the reference voltage VREF_ZQ and the voltage of the calibration node ZQ to generate the pull-up calibration codes PCODE<0:N>, which is similar to the conventional calibration circuit. Specifically, the code generating unit 320 includes a comparator 321 configured to compare the reference voltage VREF_ZQ with the voltage of the calibration node ZQ, and a counter 322 configured to count the pull-up calibration codes PCODE<0:N> in response to an output of the comparator 321.

The pull-up calibration resistor unit 330 includes parallel resistors turned on/off in response to the pull-up calibration codes PCODE<0:N>, and pulls up the calibration node ZQ. While a pull-up calibration resistor unit of a conventional calibration circuit is always calibrated such that its resistance becomes equal to the resistance of an external resistor, the pull-up calibration resistor unit 330 of the invention is calibrated such that its resistance becomes higher as the power supply voltage VDD is higher.

Therefore, the pull-up calibration resistor unit 330 is calibrated to have a resistance equal to that of the external resistor 301 if the power supply voltage VDD is equal to a predetermined voltage. However, if the power supply voltage VDD is higher than the predetermined voltage, the pull-up calibration resistor unit 330 is calibrated to have a resistance higher than that of the external resistor 301. In the contrast, if the power supply voltage VDD is lower than the predetermined voltage, the pull-up calibration resistor unit 330 is calibrated to have a resistance lower than that of the external resistor 301. The reason the pull-up calibration resistor unit 330 is calibrated in such a manner is to adjust a termination resistance if the power supply voltage VDD deviates from its stabilized normal level, that is, fluctuates. Therefore, it is preferable that the predetermined voltage has a voltage level equal to a level of the power supply voltage VDD in a normal state (stable state).

The meaning that pull-up calibration resistor unit 330 of the calibration circuit is calibrated to have a resistance higher than that of the external resistance as the power supply voltage VDD increases, is that the pull-up calibration codes PCODE<0:N> are generated so as to make the resistance increased. Therefore, the pull-up termination resistor unit of the termination resistor also has a resistance higher than an original value because the pull-up termination resistor unit has the same configuration as the pull-up calibration resistor unit 330 and receives the same pull-up calibration codes PCODE<0:N>. Resultingly, even though the power supply voltage VDD increases, it is possible to constantly maintain the amount of current flowing through an input/output node DQ because the termination resistance also increases correspondingly.

On the contrary, when the pull-up calibration resistor unit 330 is calibrated to have a resistance lower than the external resistor 301 as the power supply voltage VDD decreases, the pull-up termination resistor unit of the termination circuit also has a resistance lower than before. Therefore, even though the power supply voltage VDD decreases, it is possible to constantly maintain the amount of current flowing through the input/output node DQ because the termination resistance also decreases correspondingly.

As such, the pull-up calibration resistor unit 330 in accordance with the embodiment of the invention is calibrated in such a way that: the pull-up calibration resistor unit 330 has the resistance equal to that of the external resistance 301 if the power supply voltage VDD maintains its level to a normal voltage level; the pull-up calibration resistor unit 330 has the resistance higher than the external resistor 301 if the power supply voltage VDD has a level greater than the normal voltage level; and the pull-up calibration resistor unit 330 has the resistance lower than the external resistor 301 if the power supply voltage VDD has a level smaller than the normal voltage level.

Such a calibration of the pull-up calibration resistor unit 330 can be realized by generating the reference voltage VREF_ZQ in different manner from the conventional calibration circuit. This is because the calibration operation performed in the calibration circuit is to count the pull-up calibration codes PCODE<0:N> until the reference voltage VREF_ZQ is equal to the voltage of the calibration node ZQ.

Figure 4:
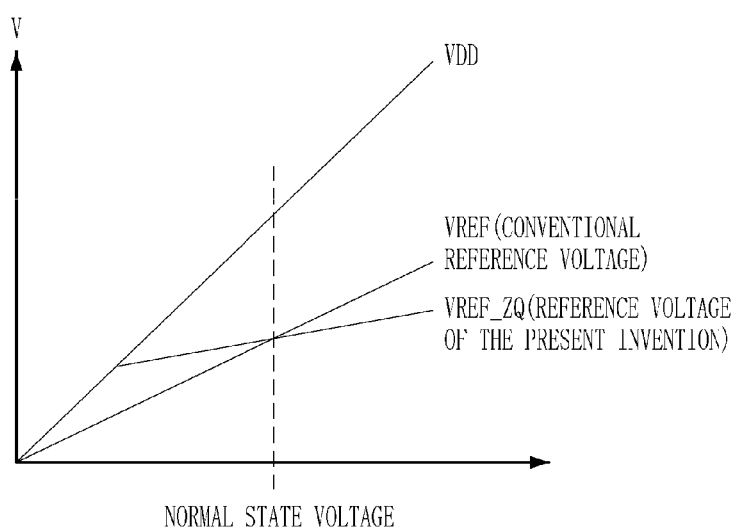
FIG. 4 is a graph illustrating a level of a reference voltage (VREF_ZQ) in the invention.

FIG. 4 is a graph illustrating a level of the reference voltage VREF_ZQ in the invention.

Figure 1:
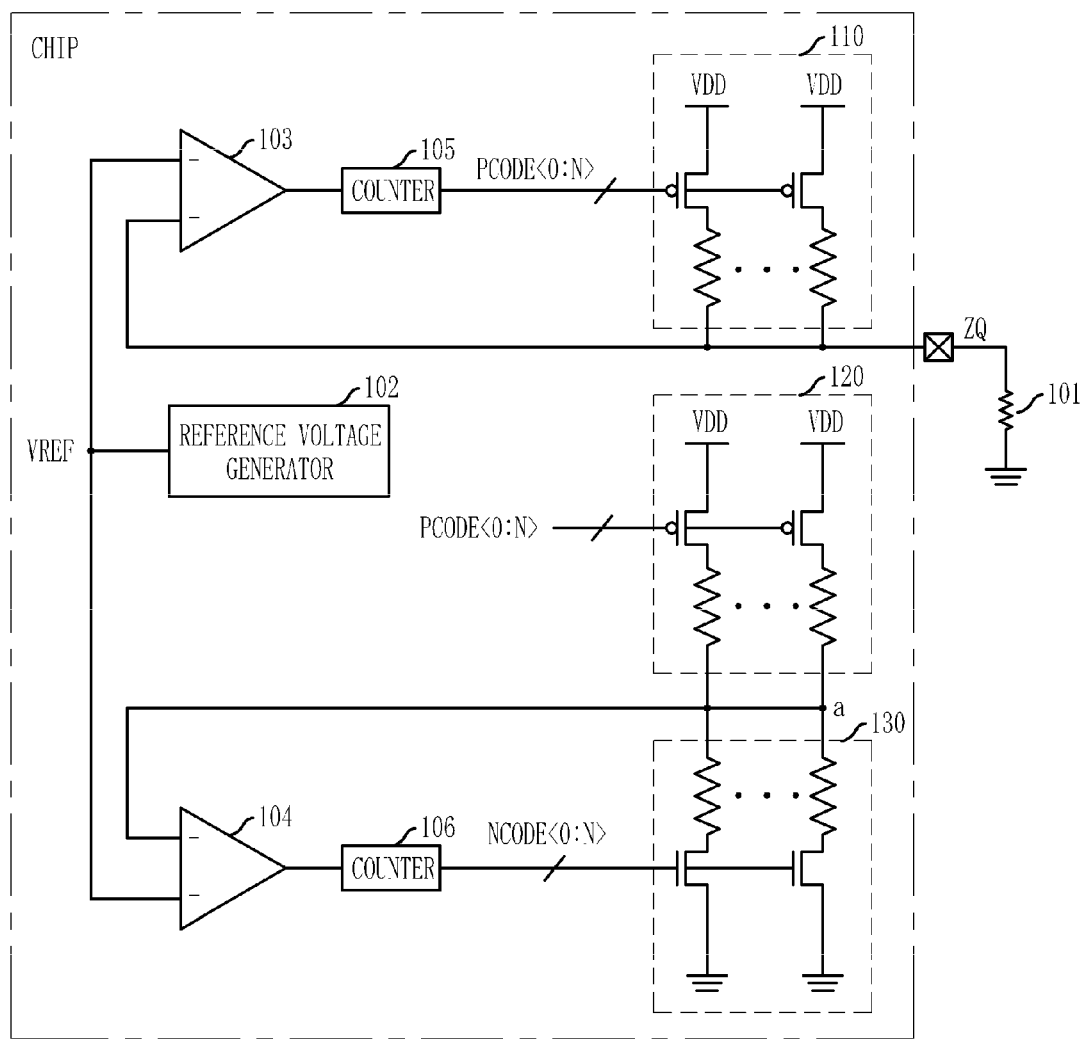
FIG. 1 is a block diagram of a calibration circuit configured to perform ZQ calibration in a conventional on-die termination (ODT) device.
Figure 2:
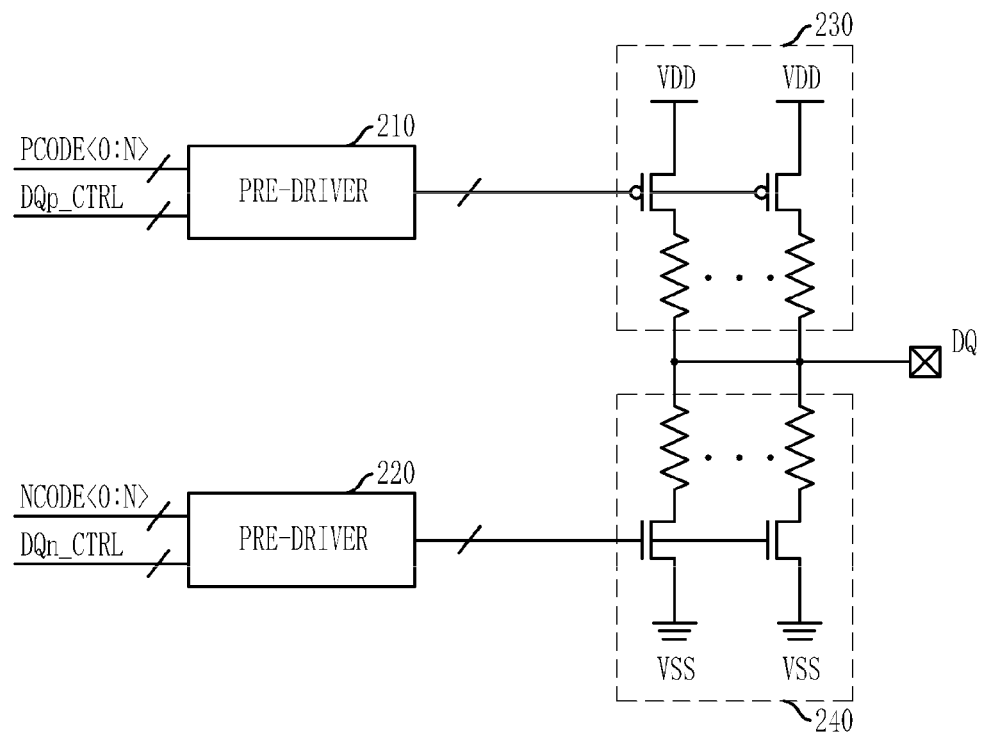
FIG. 2 is a block diagram illustrating how termination resistance of an output driver (termination circuit) of a semiconductor memory device is determined using the calibration codes (PCODE<0:N> and NCODE<0:N>) generated from the calibration circuit of FIG. 1.

Since a reference voltage VREF of the conventional calibration circuit always maintains its level at $VDD*\frac{1}{2}$, the pull-up calibration resistor unit (see 110 of FIG. 1) is calibrated such that it always has a resistance equal to that of the external resistor (101 of FIG. 1) even if the power supply voltage VDD fluctuates.

However, the reference voltage VREF_ZQ of the inventive calibration circuit has a level of half the power supply voltage VDD when the power supply voltage VDD has the same level as a predetermined voltage. Herein, as described above, it is preferable that the predetermined voltage has a voltage level of the reference voltage in a normal state, and thus the predetermined voltage will be referred to as a normal state voltage hereinafter. When the power supply voltage VDD has a level higher than the normal state voltage, the reference voltage VREF_ZQ has a voltage level lower than half the power supply voltage VDD.

The calibration operation is a procedure that the voltage of the calibration node ZQ follows the level of the reference voltage VREF_ZQ. Therefore, when the reference voltage VREF_ZQ is lower than half the power supply voltage VDD, the pull-up calibration resistor unit 330 is calibrated to have a resistance higher than that of the external resistor 301. For example, when the level of the reference voltage VREF_ZQ is $VDD*2/5$, a resistance ratio of the calibration resistor unit 330 to the external resistor 301 is 3:2.

When the level of the power supply voltage VDD is lower than that of the normal state voltage, the reference voltage VREF_ZQ becomes higher than $VDD*\frac{1}{2}$. Accordingly, the pull-up calibration resistor unit is calibrated to have a resistance lower than that of the external resistor 301. For instance, when the reference voltage is $VDD*3/5$, a resistance ratio of the calibration resistor unit 330 to the external resistor 301 is 2:3.

Specifically, the reference voltage VREF_ZQ does not have a level of $VDD*\frac{1}{2}$ but has a level of $VDD*1/N$, where N is a positive integer. Herein, the N increases as the power supply voltage VDD increases. In detail, the N is 2 when the power supply voltage VDD is equal to the normal state voltage. However, N is smaller than 2 if the power supply voltage VDD is lower than the normal state voltage, whereas N is greater than 2 if the power supply voltage VDD is higher than the normal state voltage.

Figure 5:
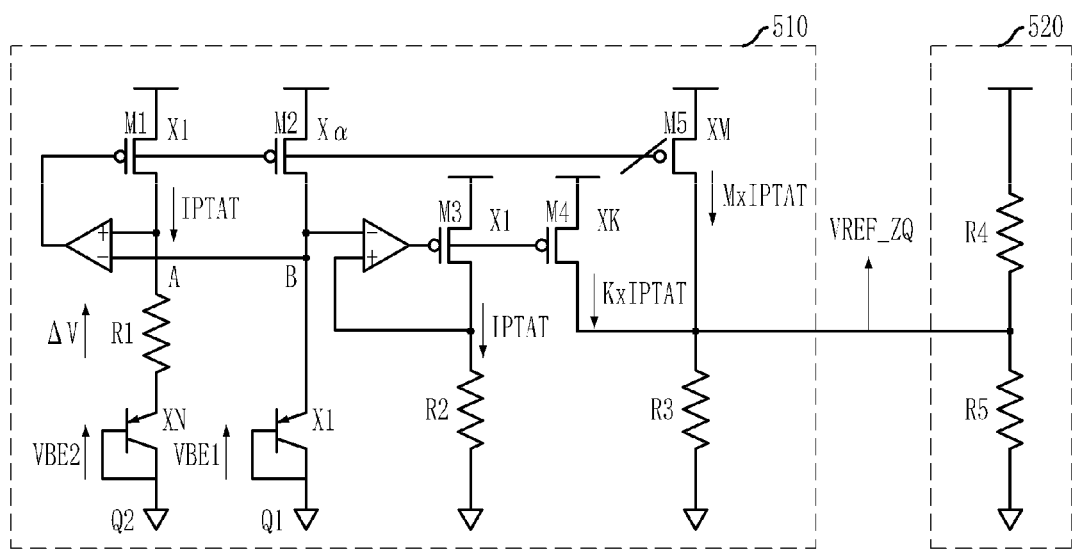
FIG. 5 is a circuit diagram of a reference voltage generator (310) configured to generate the reference voltage (VREF_ZQ) shown in FIG. 4.

FIG. 5 is a circuit diagram of the reference voltage generator 310 configured to generate the reference voltage VREF_ZQ shown in FIG. 4.

Referring to FIG. 5, the reference voltage generator 310 includes a bandgap circuit 510 configured to generate a constant voltage and a voltage dividing circuit 520 configured to divide the power supply voltage VDD to output a division voltage. The reference voltage VREF_ZQ may be achieved by connecting output terminals of the bandgap circuit 510 and the voltage division circuit 520 to each other.

First, the bandgap circuit 510 used to generate the predetermined voltage will be described below.

The bandgap circuit 510 may implemented using a vertical PNP bipolar junction transistor (BJT) which is little affected by a process variation. Specifically, the bandgap circuit 510 includes a proportional to absolute temperature (PTAT) unit of which the amount of flowing current increases according as a temperature increases, and a complementary proportional to absolute temperature (CTAT) of which the amount of flowing current decreases according as the temperature increases. Assuming that a node A and a node B are virtually shorted in the bandgap circuit 510, following Equation 1 represents the relation between a current and a voltage in a general diode, which is expressed as emitter currents of two bipolar junction transistors Q1 and Q2 having a ratio of N:1.

$$I_Q = I_S(\exp[V_{BE}/V_T]-1) \approx I_S \exp[V_{BE}/V_T]_{V_{BE} \gg V_T} \quad \text{(Equation 1)}$$

If this is applied to the BJTs Q1 and Q2, each emitter current will be expressed as following Equations 2 and 3.

$$I_{Q1} = I_S \exp[V_{BE1}/V_T] \quad \text{(Equation 2)}$$

$$I_{Q2} = N \cdot I_S \exp[V_{BE2}/V_T] \quad \text{(Equation 3)}$$

where $I_{Q1}$ denotes the emitter current flowing the BJT (Q1) and $I_{Q2}$ denotes the emitter current flowing the BJT (Q2).

In the case where the node A and the node B has the same potential, an inversely PTAT (IPTAT) current flowing through a resistor R1 will be expressed as following Equation 4.

$$I_{PTAT} = (V_{BE1} - V_{BE2})/R_1 = \ln(N \cdot \alpha) \cdot V_T / R_1 \quad \text{(Equation 4)}$$

Under the same condition, an inversely CTAT (ICTAT) current flowing through a resistor R2 will be expressed as following Equation 5.

$$I_{CTAT} = V_{BE1}/R_2 \quad \text{(Equation 5)}$$

Under the assumption that the same amount of current flows in the equal-sized MOS transistor, the IPTAT current and the ICTAT current become M*IPTAT and K*ICTAT, respectively.

Therefore, an output voltage VREF_ZQ of the bandgap circuit 510 is expressed as following Equation 6, assuming that the voltage division circuit 520 is not present.

$$\text{VREF\_ZQ} = K \cdot R3/R2 \cdot \{V_{BE1} + (M \cdot R2)/(K \cdot R1) \cdot \ln(N \cdot \alpha) \cdot V_T\} \quad \text{(Equation 6)}$$

If the values M, R1, R2, R3, K and M are appropriately adjusted to trigger temperature compensation, the output voltage VREF_ZQ has a constant level in spite of PVT variations. In general, the amounts of PTAT and CTAT current may be controlled by fixing the values N, R1, R2 and R3 and adjusting only the values K and M.

That is, the voltage with a constant level is outputted through the bandgap circuit when only the bandgap circuit 510 exists.

When the voltage division circuit 520 exists only, an output voltage of the voltage division circuit 520 becomes VREF_ZQ=VDD*(R5/(R4+R5)) by the voltage divider rule.

When the bandgap circuit 510 and the voltage division circuit 520 are connected to each other as shown in FIG. 5, the output voltage VREF_ZQ can be expressed as following Equation 7 from the current formula at an output node (VREF_ZQ).

$$\text{VREF\_ZQ} = \{(R3 \cdot R5)/(R3+R5)\} \cdot (K/R2) \cdot \{V_{BE1} + ((M \cdot R2)/(K \cdot R1)) \cdot \ln(N \cdot \alpha) \cdot V_T + \text{VDD}/(R4+R5)\} \quad \text{(Equation 7)}$$

More simplifying Equation 7, this can be represented as VREF_ZQ=A+B*VDD. That is, the reference voltage VREF_ZQ can be generated by adjusting constant values of Equation 7.

In summary, the reference voltage VREF_ZQ having a profile shown in FIG. 4 is generated by connecting the bandgap circuit 510 generating a constant voltage (A) and the voltage division circuit 520 dividing the power supply voltage VDD into the division voltage (B*VDD).

The reference voltage VREF_ZQ has the same level as the power supply voltage VDD when the power supply voltage VDD is very low in the left of FIG. 4 because the reference voltage VREF_ZQ is also generated using the power supply voltage VDD and thus the reference voltage VREF_ZQ cannot exceed the power supply voltage VDD.

Figure 6:
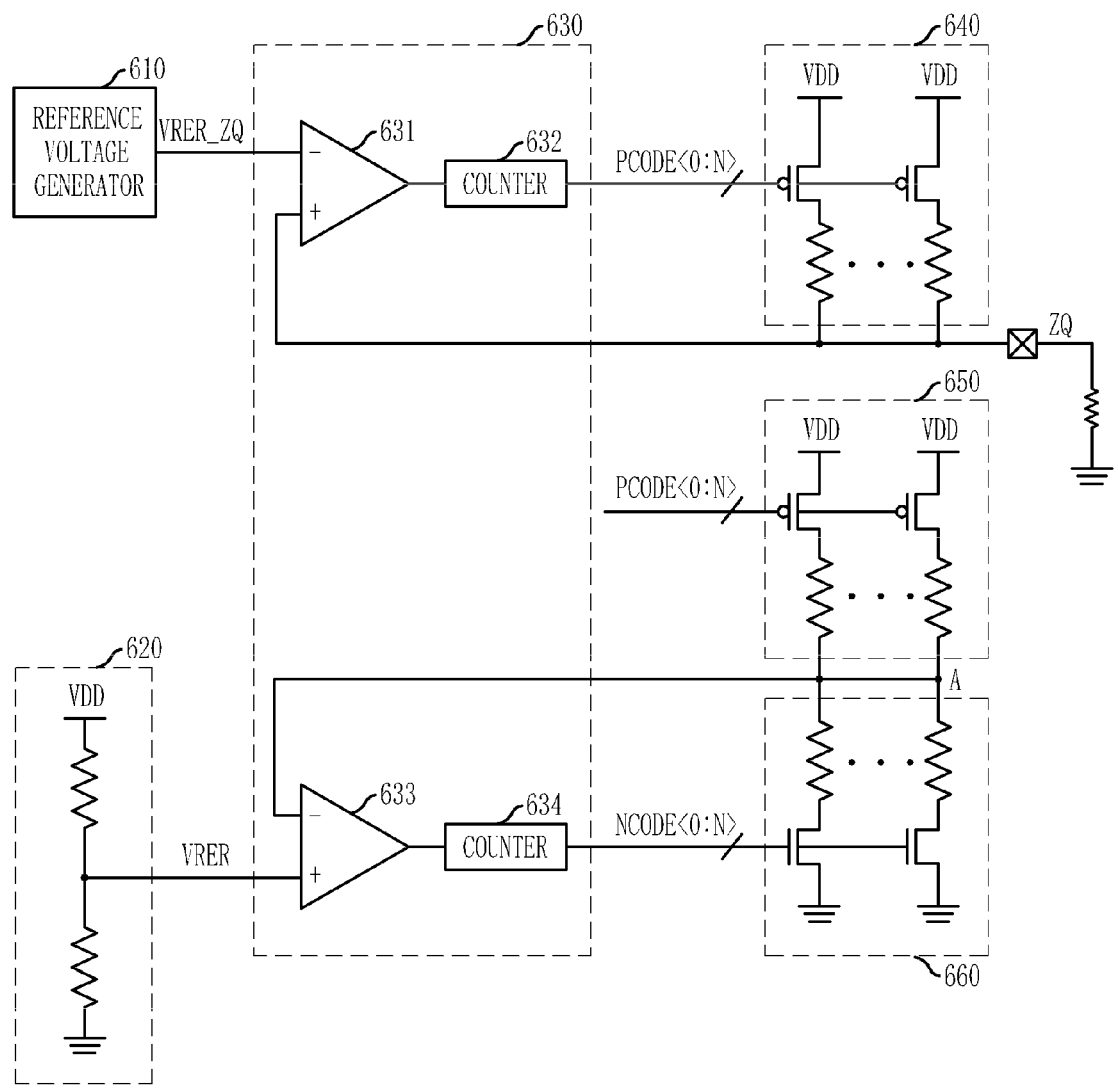
FIG. 6 is a block diagram of a calibration circuit of an ODT device generating two kinds of calibration codes in accordance with another embodiment of the invention.

FIG. 6 is a block diagram of a calibration circuit of an ODT device generating two kinds of calibration codes in accordance with another embodiment of the invention.

Referring to FIG. 6, the calibration circuit of this embodiment includes a code generating unit 630, a pull-up calibration resistor unit 640, a dummy calibration resistor unit 650 and a pull-down calibration resistor unit 660. The code generating unit 630 receives a first reference voltage VREF_ZQ and a voltage of a calibration node ZQ connected to an external resistor 601 to generate pull-up calibration codes PCODE<0:5>, and receives a second reference voltage VREF and a voltage of a node A to generate pull-down calibration codes NCODE<0:5>. The pull-up calibration resistor unit 640 pulls down the calibration node ZQ in response to the pull-up calibration codes PCODE<0:N>. The pull-up calibration resistor unit 640 is calibrated such that its resistance increases as a power supply voltage VDD increases. The dummy calibration resistor unit 650 pulls up the node A in response to the pull-up calibration code PCODE<0:N>. The dummy calibration resistor unit 650 is calibrated such that its resistance becomes equal to that of the pull-up resistor unit 640. The pull-down calibration resistor unit 660 pulls down the node A in response to the pull-down calibration codes NCODE<0:N>. The pull-down calibration resistor unit 660 is calibrated such that its resistance becomes equal to that of the dummy calibration resistor unit 650.

Reference voltage generators 610 and 620 configured to supply a first reference voltage VREF_ZQ and a second reference voltage VREF may be provided inside or outside the calibration circuit.

The code generating unit 630 generates the pull-up calibration codes PCODE<0:N> in response to the first reference voltage VREF_ZQ and a voltage of the calibration node ZQ, and generates the pull-down calibration codes NCODE<0: N> in response to the second reference voltage VREF and a voltage of the node A. The code generating unit 630 includes a first comparator 631 configured to compare the first reference voltage VREF_ZQ with the voltage of the calibration node ZQ, a first counter 632 configured to count the pull-up calibration codes PCODE<0:N> in response to an output of the first comparator 631, a second comparator 631 configured to compare the second reference voltage VREF_ZQ with the voltage of the node A, and a second counter 634 configured to the pull-down calibration codes NCODE<0:N> in response to an output of the second comparator 633.

The pull-up calibration resistor unit 640 has the same configuration as the calibration resistor unit (310 of FIG. 3) of the previous embodiment. Hence, further description for the pull-up calibration resistor unit 640 will be omitted herein.

Since the dummy calibration resistor unit 650 also has the same configuration as the pull-up calibration resistor unit 640 and receives the same pull-up calibration codes PCODE<0:

N>, the dummy calibration resistor unit 650 is equal in resistance to the pull-up calibration resistor unit 640. The dummy calibration resistor unit 650 itself is copied from the pull-up calibration resistor unit 640 and pulls up the node A, thereby generating the pull-down calibration codes NCODE<0:N>. Therefore, the dummy calibration resistor unit 650 may well have the same characteristics as the pull-up calibration resistor unit 640.

The pull-down calibration resistor unit 660 is calibrated such that its resistance becomes equal to that of the dummy calibration resistor unit 650. Consequently, the pull-up calibration resistor unit 640, the dummy calibration resistor unit 650 and the pull-down calibration resistor unit 660 have the same resistance. The pull-up calibration resistor unit 640 is calibrated such that its resistance becomes higher as the power supply voltage VDD increases as described above with reference to FIG. 3. Therefore, the dummy calibration resistor unit 650 and the pull-down calibration resistor unit 660 are also calibrated such that their resistances become higher as the power supply voltage VDD increases.

The first reference voltage VREF_ZQ is used to generate the pull-up calibration codes PCODE<0:N>, and is equal to the reference voltage VREF_ZQ used in the previous embodiment of FIG. 3. That is, the first reference voltage VREF_ZQ has a voltage level profile shown the graph of FIG. 4, and is generated through the reference voltage generator 610.

The second reference voltage VREF has a level of VDD*½ like the conventional calibration circuit. Since the pull-up calibration resistor has been calibrated such that its resistance becomes higher as the power supply voltage VDD increases, the other calibration resistor units, i.e., the dummy calibration resistor unit 650 and the pull-down calibration resistor unit 660 are calibrated in the conventional manner.

In conclusion, the calibration circuit in accordance with this embodiment of FIG. 6 is implanted by combining the calibration circuit of the embodiment of FIG. 3 and the conventional calibration circuit for generating the pull-down calibration codes. If only the pull-up calibration resistor unit 640 is calibrated as illustrated in FIG. 3, the other calibration resistor units 650 and 660 are also calibrated in the same manner, thus making it possible to achieve the same effect as the previous embodiment.

As described above, in a calibration circuit of an ODT device in accordance with the invention, a calibration resistor unit (or all calibration resistor units) of the calibration circuit is calibrated such that its resistance becomes higher than the resistance of an external resistor if a power supply voltage increases; and the calibration resistor unit of the calibration circuit is calibrated such that its resistance becomes lower than the resistance of an external resistor if the power supply voltage decreases.

Therefore, a termination resistor unit of a termination circuit e.g., an output driver has high resistance if the power supply voltage increases but has low resistance if the power supply voltage decreases. Accordingly, even if the power supply voltage fluctuates, the amount of current flowing through an input/output node can be constantly maintained.

While the invention has been described with respect to the specific embodiments, it will be apparent to those skilled in the art that various changes and modifications may be made without departing from the spirit and scope of the invention as defined in the following claims.

What is claimed is:

1. A calibration circuit of an on-die termination (ODT) device, comprising:
   a reference voltage generating circuit configured to combine a constant voltage generated from a bandgap circuit and a divided voltage generated by dividing a power supply voltage with a voltage division circuit and output the combination as a reference voltage at an intervening node between the bandgap circuit and the voltage division circuit;
   a code generating unit configured to generate pull-up calibration codes in response to a voltage of a calibration node connected to an external resistor and the reference voltage; and
   a pull-up calibration resistor unit configured to pull up the calibration node in response to the pull-up calibration codes
   wherein:
   the pull-up calibration resistor unit is calibrated to have a resistance equal to that of the external resistance and the reference voltage is substantially equal to a half of the power supply voltage when the power supply voltage is equal to a predetermined voltage;
   the pull-up calibration resistor unit is calibrated to have a resistance higher than that of the external resistance and the reference voltage is lower than a half of the power supply voltage when the power supply voltage is higher than the predetermined voltage; and
   the pull-up calibration resistor unit is calibrated to have a resistance lower than that of the external resistance and the reference voltage is higher than a half of the power supply voltage when the power supply voltage is lower than the predetermined voltage.

2. The calibration circuit as recited in claim 1, wherein the reference voltage has a voltage level of the power supply voltage*1/N where N is a positive integer and increases as the power supply voltage is raised.

3. The calibration circuit as recited in claim 1, wherein the predetermined voltage has a voltage level of the power supply voltage in a normal state.

4. A calibration circuit of an ODT device, comprising:
   a reference voltage generating circuit configured to combine a constant voltage generated from a bandgap circuit and a divided voltage generated by dividing a power supply voltage with a voltage division circuit and output the combination as a reference voltage at an intervening node between the bandgap circuit and the voltage division circuit;
   a code generating unit configured to generate pull-up calibration codes in response to a voltage of a calibration node connected to an external resistor and a first reference voltage, and configured to generate pull-down calibration codes in response to a voltage of another node and a second reference voltage;
   a pull-up calibration resistor unit configured to pull up the calibration node in response to the pull-up calibration codes;
   a dummy calibration resistor unit configured to pull up said another node in response to the pull-up calibration codes, the dummy calibration resistor unit being calibrated such that its resistance becomes equal to that of the pull-up calibration resistor unit; and
   a pull-down calibration resistor unit configured to pull down said another node in response to the pull-down calibration codes, the pull-down calibration resistor unit being calibrated such that its resistance becomes equal to that of the dummy calibration resistor unit, wherein:
   the pull-up calibration resistor unit is calibrated to have a resistance equal to that of the external resistance and the first reference voltage is substantially equal to a half of the power supply voltage when the power supply voltage is equal to a predetermined voltage;

the pull-up calibration resistor unit is calibrated to have a resistance higher than that of the external resistance and the first reference voltage is lower than a half of the power supply voltage when the power supply voltage is higher than the predetermined voltage; and the pull-up calibration resistor unit is calibrated to have a resistance lower than that of the external resistance and the first reference voltage is higher than a half of the power supply voltage when the power supply voltage is lower than a predetermined voltage.

5. The calibration circuit as recited in claim 4, wherein the second reference voltage is equal to a half of the power supply voltage.

6. The calibration circuit as recited in claim 4, wherein the reference voltage has a voltage level of the power supply voltage*1/N where N is a positive integer and increases as the power supply voltage is raised.

7. The calibration circuit as recited in claim 4, wherein the predetermined voltage has a voltage level of the power supply voltage in a normal state.

8. The calibration circuit as recited in claim 4, wherein the second reference voltage is generated by dividing the power supply voltage.

* * * * *